United States Patent [19]

Curtin

[11] Patent Number: 5,237,514
[45] Date of Patent: Aug. 17, 1993

[54] MINIMIZING PATH DELAY IN A MACHINE BY COMPENSATION OF TIMING THROUGH SELECTIVE PLACEMENT AND PARTITIONING

[75] Inventor: James J. Curtin, Fishkill, N.Y.

[73] Assignee: International Business Machines Corporation, Armonk, N.Y.

[21] Appl. No.: 632,454

[22] Filed: Dec. 21, 1990

[51] Int. Cl.⁵ .......................................... G06F 15/60
[52] U.S. Cl. ................................. 364/490; 364/489; 364/488
[58] Field of Search ............... 364/488, 489, 490, 491

[56] References Cited

U.S. PATENT DOCUMENTS

| | | | |
|---|---|---|---|
| 3,654,615 | 4/1972 | Freitag | 364/491 |
| 4,263,651 | 4/1981 | Donath et al. | 364/300 |
| 4,495,559 | 1/1985 | Gelatt et al. | 364/491 |
| 4,564,943 | 1/1986 | Collins et al. | 371/28 |
| 4,615,011 | 9/1986 | Linsker | 364/491 |
| 4,654,851 | 5/1987 | Busby | 371/27 |
| 4,656,580 | 4/1987 | Hitchcock, Sr. et al. | 364/200 |
| 4,688,947 | 8/1987 | Blaes et al. | 368/120 |
| 4,698,760 | 10/1987 | Lembach et al. | 364/490 |
| 4,787,061 | 11/1988 | Nei et al. | 364/900 |
| 4,835,705 | 5/1989 | Fujino et al. | 364/491 |

OTHER PUBLICATIONS

"Circuit Placement for Predictable Performance" by Hange et al., IEEE 1987, pp. 88–91.
"Timing Influenced Layout Design" by Burstein et al., IEEE 22nd Design Automation Conf., 1985, pp. 124–130.
"Partitioning and Placement Technique for CMOS Gate Arrays" by Odawara et al., IEEE on C.A.D., vol. CAD-6, No. 3, May 1987, pp. 355–363.
"Analysis of Placement Procedures for VLSI Standard Cell Layout" by Hartoag, IEEE 23rd Design Automation Conf., 1986, pp. 314–319.
IEEE International Conference on Computer Aided Design, ICCAD-89 Digest of technical papers, 1988, pp. 52–5, entitled "Constrained Conditional Resource Sharing in Pipeline Synthesis".
VLSI Design, vol. 6, No. 2, Feb. 1985, pp. 86–91 entitled "Path-Delay Computation Algorithms for VLSI Systems".
IEEE Internatoinal Test Conference Proceedings 19–21 Nov. 1985, pp. 334–341 entitled "The Error Latency of Delay Faults in Combinations and Sequential Circuits".

*Primary Examiner*—Vincent N. Trans
*Attorney, Agent, or Firm*—Henri Daniel Schnurmann

[57] ABSTRACT

A method for minimizing cycle time to improve machine performance is described. The approach prioritizes placement and partitioning decisions based on the criticality of paths and their constituent net segments. It provides an initial coarse approximation to a final more optimum configuration by iteratively improving on it through the use of deterministic techniques. The method optimizes placement by means of heuristic algorithms that are based on a cost function that is dependent on net segment and path criticality.

22 Claims, 11 Drawing Sheets

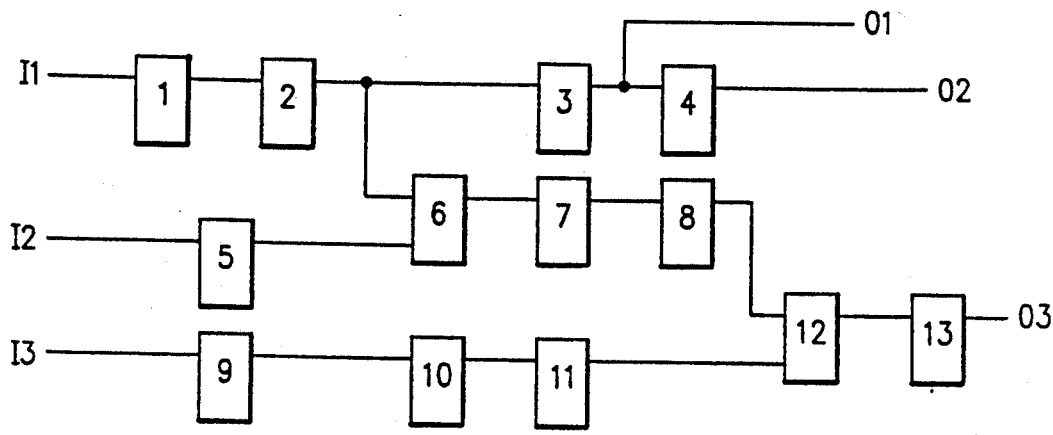
FIG.2A
| PATHS | | BLOCKS IN PATH |
|---|---|---|
| PATH 1 = I1 TO O1 = 1 – 2 – 3 | | 3 |
| PATH 2 = I1 TO O2 = 1 – 2 – 3 – 4 | | 4 |
| PATH 3 = I1 TO O3 = 1 – 2 – 6 – 7 – 8 – 12 – 13 | | 7 |
| PATH 4 = I1 TO O3 = 5 – 6 – 7 – 8 – 12 – 13 | | 6 |
| PATH 5 = I1 TO O3 = 9 – 10 – 11 – 12 – 13 | | 5 |
FIG.2B
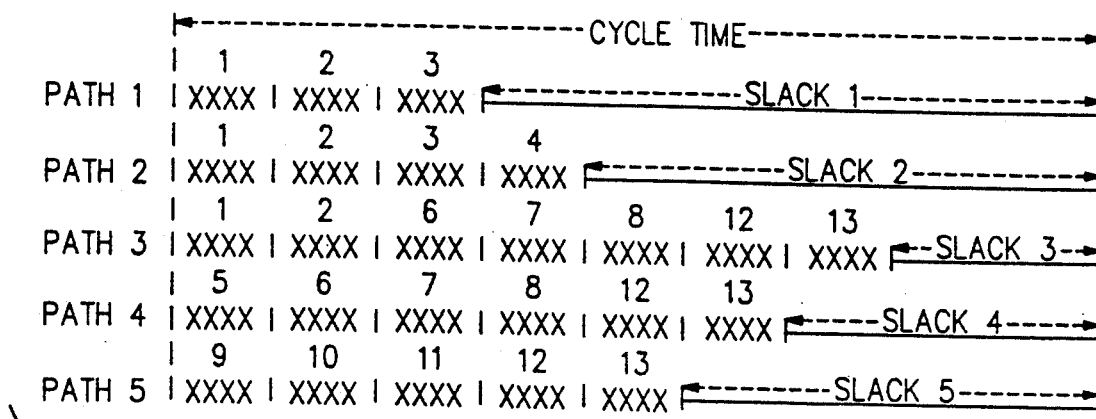
FIG.2C

FIG.2G

| 'PINNED' SEGMENTS | | |
|---|---|---|
| SEGMENT | VALUES | SMALLEST VALUE |
| 1/2 | 1.70 1.07 0.43 | 0.43 |
| 2/3 | 1.70 1.07 | 1.07 |
| 6/7 | 0.43 0.56 | 0.43 |
| 7/8 | 0.43 0.56 | 0.43 |
| 12/13 | 0.43 0.56 0.75 | 0.43 |
| 8/12 | 0.43 0.56 | 0.43 |

FIG.2H

| NET SEGMENT | SLACK |
|---|---|
| 1/2 | 0.43 |
| 2/3 | 1.07 |
| 3/4 | 1.07 |
| 2/6 | 0.43 |
| 5/6 | 0.56 |
| 6/7 | 0.43 |
| 7/8 | 0.43 |
| 9/10 | 0.75 |
| 10/11 | 0.75 |
| 11/12 | 0.75 |
| 12/13 | 0.43 |
| 8/12 | 0.43 |

FIG.2I

NET SLACK SEQUENCE (ASCENDENCY RULE)

METHOD 1:

| | |
|---|---|
| 1/2 | 0.43 |
| 2/6 | 0.43 |
| 6/7 | 0.43 |
| 7/8 | 0.43 |
| 12/13 | 0.43 |
| 8/12 | 0.43 |
| 5/6 | 0.56 |
| 9/10 | 0.75 |
| 10/11 | 0.75 |
| 11/12 | 0.75 |
| 2/3 | 1.07 |
| 3/4 | 1.07 |

FIG.2J

PATH 1 = 0.43 + 1.07
PATH 2 = 0.42 + 1.07 + 1.07
PATH 3 = 0.43 + 0.43 + 0.43 + 0.43 + 0.43
PATH 4 = 0.56 + 0.43 + 0.43 + 0.43 + 0.43
PATH 5 = 0.75 + 0.75 + 0.75 + 0.43 + 043

| | SLACK ACTUAL | SLACK TARGET | PATH DELAY |
|---|---|---|---|
| | 1.50 | 3.4 | 2.10 |
| | 2.57 | 2.6 | 3.37 |
| | 2.60 | 2.6 | 4.00 |
| | 2.28 | 2.8 | 3.48 |
| | 2.68 | 3.0 | 3.68 |

NET COAGULATION: SOLITAIRE PROCEDURE

'ASCENDENCY' NET LISTING

| NET SEGMENT | SLACK VALUE |
|---|---|
| 1/2 | 2 |
| 5/9 | 2 |
| 13/17 | 2 |
| 3/6 | 3 |
| 2/11 | 3.5 |
| 17/19 | 5 |
| 11/13 | 7 |

SOLITAIRE PROCEDURE:

| | GROWTH CENTERS | | | | COMMENTS: |
|---|---|---|---|---|---|
| | 1 | 2 | 3 | 4 | |
| STEP1 | 1-2 | | | | 1ST G.C. |
| STEP2 | 1-2 | 5-9 | | | 2ND G.C. |
| STEP3 | 1-2 | 5-9 | 13-17 | | 3RD G.C. |
| STEP4 | 1-2 | 5-9 | 13-17 | 3-6 | 4TH G.C. |
| STEP5 | 1-2<br>2-11 | 5-9 | 13-17 | 3-6 | GROWTH IN 1ST |
| STEP6 | 1-2<br>2-11 | 5-9 | 13-17<br>17-19 | 3-6 | GROWTH IN 3RD |
| STEP7 | 1-2<br>2-11<br>11-13 | 5-9 | 13-17<br>17-19 | 3-6 | MORE GROWTH IN 1ST |
| STEP8 | 1-2<br>2-11<br>11-13<br>13-17<br>17-19 | 5-9 | | 3-6 | 3RD G.C. 'LINKED' TO 1ST G.C. |

NESTING HIERARCHY – LEVELS

AGGREGATION

NET SEGMENT HIERARCHY – PARTITIONED BY GROWTH CENTER

INDEXED GROWTH HISTORY

——— INDICATES BLK – BLK CONNECTIONS WITHIN GC #1
- - - INDICATES BLK – BLK CONNECTIONS BETWEEN GC #1 & GC #4

LEVELS & SUBSETS

PARTITIONING

UNPARTITIONED PATH

|←------------------PATH SLACK------------------→|

'EQUIPARTITION'

| NS1 | NS2 | NS3 | NS4 | NS5 | NS6 | NS7 |

NET SEGMENT SLACK = PATH SLACK / # NET SEGMENTS
NS1 = NS2 = NS3= ... = NS7 = [PATH SLACK /7]

PARTITIONED PATH

|←----------REDUCED PATH SLACK----------→|

ALTERED 'EQUIPARTITION'

|NS1|NS2|NS3|NS4|   NS5   |NS6|NS7|

NET SEGMENT SLACK = PATH SLACK / EQUIVALENT NS'S
NS1=NS2=NS3=NS4=NS6=NS7 = [PATH SLACK X (1/56)]
NS5 = [PATH SLACK X (50/56)]

FIG.6D

MEASURING 'GOODNESS'

NET 1

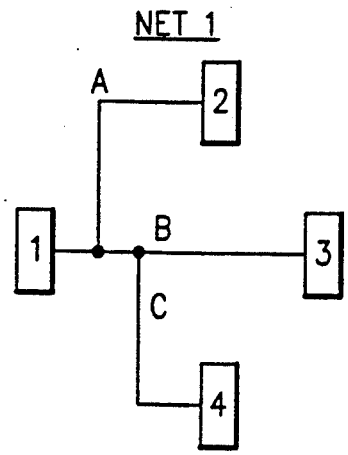

FIG.7A

NET 1 = NS(A) + NS(B) + NS(C)

| PATH | SLACK | CRITICALITY | WEIGHT |
|------|-------|-------------|--------|
| 1 | 2.3NS | 526 | $2^1$ |
| 2 | 1.8NS | 461 | $2^2$ |
| 3 | 2.7NS | 749 | $2^0$ |

MEASURING 'GOODNESS'

| | WEIGHT | $2^2$ | $2^1$ | $2^0$ |
|---|---|---|---|---|
| | PATH # | 2 | 1 | 3 |
| | 0 | + | + | + |
| | 1 | + | + | − |
| COMPOSITE | 2 | + | − | + |
| ACCEPT | 3 | + | − | − |
| WEIGHT | 4 | − | + | + |
| | 5 | − | + | − |
| | 6 | − | − | + |
| | 7 | − | − | − |

MINIMIZING PATH DELAY IN A MACHINE BY COMPENSATION OF TIMING THROUGH SELECTIVE PLACEMENT AND PARTITIONING

FIELD OF THE INVENTION

This invention relates to minimizing the path delay between circuits by optimizing their placement in an integrated circuit package as a function of path delay criticality thereby improving the cycle time and the performance of a machine.

BACKGROUND OF THE INVENTION

The speed of complex machines is commonly determined by the time delay of electrical signals through their electronic components. In the process of designing a machine of certain speed, particular attention is given to the critical paths, since they are the ones that determine the machine cycle and help define how fast a machine can run. Attempts to minimize a machine cycle by improving the performance of circuits does not by itself guarantee a faster machine. Other considerations (independent of the functional circuit delay) pertaining to layout, such as chip or floor planning, partitioning, placement and wire routing have played an ever increasing role in the design of machines. As a result, it is not uncommon to find a small number of data paths with excessive delay playing an important role in limiting the machine cycle of a computing machine. Considerable effort has been expended by design practitioners in optimizing data paths by minimizing length so as to reduce wire capacitance and resistance and the distance for a signal to travel.

An example of how a logic function comprised of a plurality of interconnected blocks may be decomposed into constituent paths, such as signal paths, machine paths, etc., and a determination of relative path delay value extremes for each path is described in U.S. Pat. No. 4,263,651 to W. E. Donath et al and of common assignee.

In another instance, such as U.S. Pat. No. 4,564,943 to J. C. Collins et al, and of common assignee, delay paths are stressed for their extremes to assist in the characterization of a design that is to be frozen. No attempt, though is made to optimize the overall timing.

In U.S. Pat. No. 4,698,760 to R. E. Lembach and of common assignee, optimization of the signal timing delay is arrived at by actually altering the circuit block through the selection of different logic book types. This method does not address timing optimization by placement and partitioning methods.

Heuristic techniques which explore the permutation space of all possible block placements must conduct their trial and error search by using a guiding or goal oriented mechanism called 'cost' or 'objective' function. Several papers in various publications have been published, whereby attempts to minimize the 'cost' function have been made:

"Optimization by Simulated Annealing", by S. Kirkpatrick, C. D. Gelatt, and M. P. Vecchi, Science, Vol. 220, No. 4598, pp. 671-680. This highlights the connection that exists between statistical mechanics and combinatorial optimization. It discusses the strong analogy with annealing in solids, thus providing a framework for optimizing the properties of very large and complex systems. This approach does not formulate Constructive Placement algorithms for initial placement or address timing optimization of specific critical paths and geometric constraints of path segments. Moreover, it does not provide interactive guidance for defining the assumptions required for initial conditions—such as partitioning boundaries, modelling and optimization of a complete machine.

"ESP: Placement by Simulated Evolution", by R. M. Kling and P. Banerjee, IEEE Transactions on Computer-Aided Design of Integrated Circuits & Systems, (1989), Vol 8, No. 3, pp. 245-256 discloses a method which is similar to the previous reference but uses a different heuristic algorithm that involves multiple block relocations as opposed to pair swapping. Even though it is a method of simulating an evolutionary process that effectively minimizes cell interconnection length, it contains the same limitations as the previous approach.

"Genetic Placement", by J. P. Cohoon and W. D. Paris, 1986 IEEE Intl. Conference on Computer Aided Design, pp. 422-425, is similar to the two previous approaches and with the same limitations.

"A new Approach for Solving the Placement Problem using Force Models", by K. J. Antreich, F. M. Johannes and F. H. Kirsch, IEEE International Symposium on Circuits and Systems, June 1982, pp. 481-486 discloses a Force Model using pair swapping just as in Simulated Annealing and iterates to a solution as in all previously mentioned cases. Its cost function is based on modelling of interconnection's affinities as a function of the forces of attraction and repulsion between blocks until equilibrium is reached. Again, the same limitations are found.

"Stochastic Evolution: A Fast Effective Heuristic for some Generic Layout Problems" by Y. G. Saab & V. B. Rao, Proceedings of the 27th Design Automation Conference, 1990, pp. 26-31 is another heuristic technique that seeks faster solution results and better quality than that found in Simulated Annealing. It operates on the principle that states are deemed suitable for survival based on an evaluation by the cost function. Its algorithm includes backtracking of proposed block moves if changes are deemed unsuitable for survival. Once again, the same limitations as previously mentioned are found.

Most importantly, all of the referenced publications collectively attempt to achieve a faster machine solution by minimizing total wiring or capacitance of the nets within a machine architecture. No systematic procedure exists for determining the priority of block placement based on how critical certain signal paths may be or the geometric constriction of their 'net segments'. None of the previously described approaches offer an initial placement strategy or guidance to assist in the human decision process where judgement involving partitioning and I/O constraints force certain initial conditions that reside outside the purview of the method of placement. Thus, a faster machine cannot be guaranteed when the algorithms that carry out an optimization are based on total wire, total capacitance or some other summation parameter. One may arrive at a placement scenario which may have the least amount of total wire or capacitance but which results in a slower machine than some other placement with greater wire or capacitance. This can occur when the machine speed is limited by the longest path and not by the largest amount of wire or capacitance.

Most heuristic placement algorithms presently operate with a variety of 'cost' or 'objective' functions as found in the above described Simulated Annealing and Genetic Placement methods. Some, such as 'Min-Cut', attempt to minimize wire congestion and channel competition by intelligent placement. Others, such as 'Bounded Rectangle', 'Concentric Circle', and 'Position Oriented' seek to improve machine cycle and performance by minimizing total wire or total capacitance. These timing directed functions share a common factor in that they are all net oriented, handling all segments of a given net as one net entity.

SUMMARY AND OBJECTS OF THE INVENTION

The present invention optimizes machine speed by specifically prioritizing a block placement that concurrently addresses the criticality of a path and the restricted degrees of freedom dictated by both the slack and the number of segments (i.e., block-to-block interconnections) in each path. It uses a deterministic process that prioritizes block placement and provides an initial block placement strategy and 'hierarchical nesting' of circuit groups that are based on timing requirements. This 'hierarchical nesting' can assist the human decision process needed for establishing partitioning boundaries within given I/O constraints.

The present invention, furthermore, introduces a novel 'cost' function by treating each net segment member as a path-weighted entity, and makes a judgement that is based on the prioritized path effects of moving a block placement.

It is therefore a primary object of this invention to efficiently and economically locate functional blocks for an entire computing machine, preferably comprised of a large number of blocks, so as to achieve minimum cycle time, thus improving or exceeding machine MIPS objectives.

Another object is to provide a method for creating a 'Constructive Initial Placement Seed' for optimizing path delay and minimizing cycle time within long path and short path constraint considerations.

A further object is to provide a method for improving cycle time by optimizing the combined effect of 'Functional Work' delay (e.g., logic block 'Communication' delay (e.g., wire connections between blocks dictated by placement, wiring, etc.).

Still another object of the invention is to generate a 'cost' function which circumvents 'Path Bundling' by executing net evaluation through composite critical path weighting in its quest for minimizing critical paths and machine cycle time.

A more particular object is to provide an improved heuristic placement algorithm similar to the above described Simulated Annealing, Genetic Placement and Simulated Evolution to achieve optimum logic block placement.

Yet a further object is to foster a better human understanding and interactive participation in the design optimization process and, more particularly, in fostering intelligent decisions regarding initial conditions which reside outside the purview of the placement procedure.

These and other objects are achieved by use of the present invention which is: a method for minimizing path delay and optimizing machine cycle by identifying all the 'net segments' comprising the machine and prioritizing them in accordance to their relative importance; achieving an initial coarse approximation to the final optimum configuration based on relative 'net segment' criticality; improving this initial approximation to a final optimum configuration by assigning a cost function to those 'net segments' based on the previously determined relative 'net segment' criticality; and using the cost function to achieve an improved configuration by heuristic means.

BRIEF DESCRIPTION OF THE DRAWINGS

The advantages of this invention will be apparent from the following and more particular description of the preferred embodiment as illustrated in the accompanying drawings, in which:

FIGS. 2A-2K are an illustrative example of the various steps starting from initialization of the path definition through the establishment of a 'net segment' hierarchy ('ascendency' rule);

FIGS. 3A and 3B show an example of 'net coagulation' via the 'solitaire' procedure;

FIGS. 6A-6D are an example of how partitioning can be factored into the calculation of the slack function, thus providing a more effective evaluation of a given design alternative; and FIGS. 7A-7C are an example how to measure 'goodness' in the process of optimizing in the presence of 'path bundling'.

DESCRIPTION OF THE PREFERRED EMBODIMENT

The broad, overall concepts for minimizing path delay between circuits to improve cycle time and performance of a computing machine may be better understood by subdividing the proposed methodology in two major subdivisions: 1) an initial approximation to a path definition, and 2) optimizing the path defined.

Initial Approximation

A single data path of excessive delay can limit the cycle time of a machine. As a result, combinatorial optimization techniques that optimize solutions for aggregate 'cost' or 'objective' functions (e.g., 'total wire' minimization) do not directly address the problem of minimizing cycle time. Even objectives such as 'total path delay' may be improper because a path delay distribution with low 'total' and low accumulated average (i.e., mean) but with uncharacteristic 2 and 3 sigma members, is less effective than a distribution with higher 'total' and nominal value, but with smaller deviation and shorter 'longest path'. Whereas it is generally true that minimizing 'total wire' length and, consequently, 'average path delay' may lead to a faster cycle time, it is also true that violations of this rule by intelligent fluctuation may produce an even faster cycle.

Assuming no ability to change the logic block delay (i.e., designs for which the path 'functional work' delay is given), the remaining area of design flexibility is the 'net segment' delay (also referred to as 'communication delay') which is dictated by placement, routing, etc. Accordingly, the wire length flexibility can be expressed as:

$$\text{Cycle Time} - \text{Functional Work Delay} = \text{Path Slack}.$$

Thus, for a critical path, $$\text{Wire Delay} \geq \text{Path Slack},$$

whereas for a fast path, $$\text{Wire Delay} \geq \text{Race Time Requirement}.$$

Any 'averaging' technique measures total or accumulated behavior of the ensemble of paths, and is only inferentially related to the problem. Aggregate path behavior does not dictate cycle speed, only the slowest paths do. Thus any of the combinatorial optimization techniques that are chosen, whether Simulated Annealing, Genetic Placement, Simulated Evolution, etc., will require a careful definition of the optimized 'target parameter'.

Figure 1:
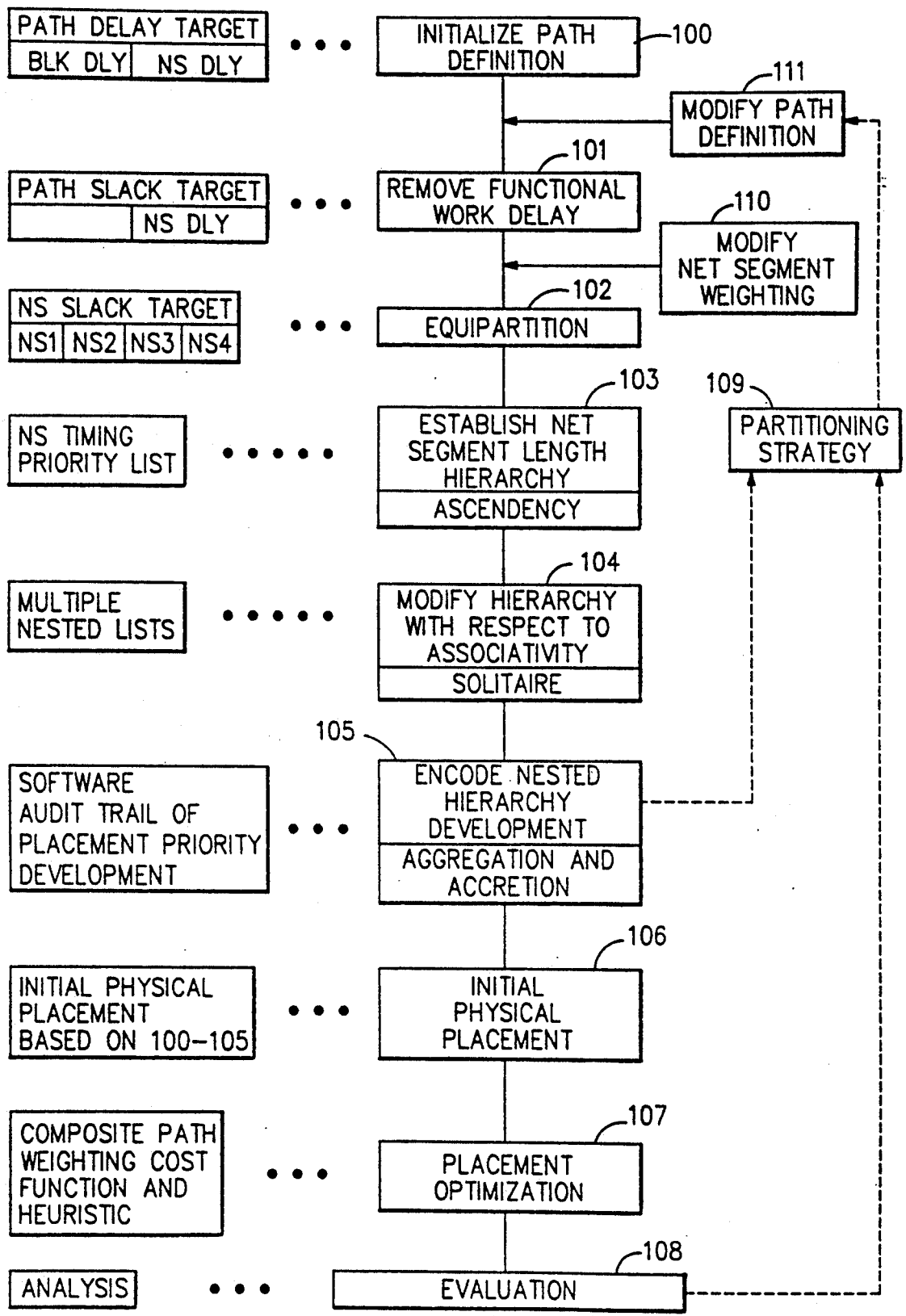
FIG. 1 is a flow diagram of the process required for creating a 'Constructive Initial Placement Seed' and generating a 'Path Slack Dependent Cost' function in order to minimize path delay and optimize the cycle time of a machine.

The process flow of a prioritized placement of blocks leading to an optimized design is shown in FIG. 1. Block 100, 'initialize path definition' contains an equation definition for each machine path, where the path delay is equal to the sum of all functional block member delays and all 'net segment' delays (FIG. 2a). For each functional block member listed in the path definition, an appropriate block delay field is retrieved. For each 'net segment' member, the corresponding source and destination names (also referred to as 'come from' and 'go to' blocks) are listed as variables.

An initial placement 'seed' procedure does not require an exhaustive, complex or highly accurate approximation of the final optimum. Such algorithms are so time consuming and cost prohibitive that they are unrealizable in actual practice. An implementable 'seed' solution will only succeed if a set of powerful simple rules can be devised that accomplish the desired net slack to block location tailoring required to meet the machine path delay target. Accordingly, rules must be discovered that are simple in terms of computation and sufficiently powerful that they appropriately reflect the complexity of path interaction requirements and net slack tailoring in the positioning and partitioning of the blocks.

The ultimate object is, therefore, to minimize the slowest path contribution and, in the process, to tighten up the slack distribution of the ensemble of paths by placement compensation. This is achieved by generating an equation for each path such that it expresses the path slack in terms of net slack contribution to the path. The set of path equations is then solved for the slack values of the 'net segments' and the values are used to construct an initial placement seed position for Simulated Annealing, Simulated Evolution, Genetic Placement, etc, equation. The equation is solved while carefully monitoring the 'target parameter', namely, the one that emphasizes minimum slack on the critical paths. Thus, the path equation is as follows:

$$y_1 = kx_1 + kx_2 + kx_3 + \ldots + kx_n$$

where, y=path slack, x='net segment slack', and k=contribution or presence factor.

Accordingly, a set of equations is generated representing all the paths:

$$y_1 = kx_1 + kx_2 + kx_3 + \ldots + kx_n$$
$$y_2 = kx_1 + kx_2 + kx_3 + \ldots + kx_n$$

-continued
$$y_3 = kx_1 + kx_2 + kx_3 + \ldots + kx_n$$
$$\vdots$$
$$y_n = kx_1 + kx_2 + kx_3 + \ldots + kx_n$$

Each 'path slack' is now expressed as a function of its 'net segment' member length:

$$S_1 = f(NS_1 + NS_3 + NS_4 + NS_8 + NS_{12}),$$

where:
  $S_1$ is the path slack for path 1;
  $NS_1$ the 'net segment' 1, etc., to be followed by expressing each 'net segment' in terms of its source and destination blocks:

$NS_1 = A/B$, $NS_2 = B/G$, $NS_3 = G/F$, $NS_4 = F/N$,
  $NS_5 = N/R$, such that $S1 = A/B + B/G + G/F + F/N + N/R$.

Solving this set of equations will give a per 'net segment' delay or slack contribution which will adjust all path delays to approach their desired values. This per 'net segment' delay factor can be translated into a block placement tag for Simulated Annealing placement algorithms. The matrix of simultaneous equations is large in that its x dimension is a set equal to the number of blocks in the machine, while its y dimension is equal to the number of paths in the machine—a generally much larger number.

Rent's Rule states that "the circuits in a typical system can be connected with short-range interactions if they are imbedded in a space that exists between two or three dimensions".

It is evident that, in view of Rent's Rule, the matrix is sparce with most 'net segments' having their own individual degrees of freedom constrained solely by the path slack aggregate delay—the sum of 'net segment's' delay in path'slack, and path interaction, whereby, pinning of some other path by the mutual sharing of one or more of the same segments occurs. If there is no pinning, the matrix degenerates into a listing of independent equations with no interactions. If all the paths share all 'net segments', the matrix becomes full and potentially solvable by overdetermined regression techniques which are readily known to one skilled in the art.

The matrix of equations usually fails to yield a unique or overdetermined approximate solution space, since so much 'freedom of action' exists in the placement of 'net segments' in spite of the partial pinning that links the paths. It is however, possible to generate a placement seed by 'equipartition' and substitution techniques without having to manipulate any matrix steps by supercomputer algorithms.

Having deleted all the 'functional work' delays leaving only the 'net segment' delays, a 'path slack' target is then defined (FIG. 1, block 101). As mentioned, the 'path slack' is defined as the difference between cycle time and the sum of all path member block delays.

In the next step, an 'equipartition' list (block 102) is created by determining the total count of the 'net segments' contained in the Path Slack Definition for each path in the list and, preferably, dividing each path slack by this number. It is evident that other forms of division could have been advantageously used, such as dividing by $N^{\frac{1}{3}}$ to reflect non-linear geometric constraints. A file is then created with fields for each 'net segment' and equipartition value. It is also evident that multiple paths can pass through any given block-to-block 'net segment'. If each path is analyzed independently during 'equipartition' as it also is intended, different values will arise for the multi-path 'net segments' based on the timing needs of each distinct path through that segment. A comparison is then made for multiple values of 'net segments' with the same name by searching the list for multiple occurrences and by comparing values and accepting the lowest one.

With the 'net segment' list created in this manner, each 'net segment' name appears only once. The accepted value is placed in the field associated with the corresponding 'net segment' name.

The next step 'establish net segment length hierarchy' (block 103) essentially creates a 'net segment' timing priority list by means of the 'ascendency' procedure. Thereby, 'net segments' are ordered in ascending order as a function of individual delay values and implicit length.

During the execution of this procedure, particular care should be taken to avoid placing unrelated or loosely coupled pairs near one another. Moreover, placing all short delay 'net segments' first, without regard to 'associativity', is too simplistic. It may eventually lead to consuming valuable real estate by juxtaposing short nets that have only 'remote' interconnection closure with one another. Therefore, it has been found to be more advantageous to first establish a measure of 'familial closeness' to help prioritize layout by establishing 'centers-of-growth' and placement proliferation around those centers. No inherent intelligence or capability exists in a hierarchy based on 'distance-between-blocks' to establish 'familial closeness' for 'centers-of-growth'. Moreover, the technique of hierarchical placement tends to imply a single proliferating point source for placement and wiring. It is unlikely that such an approach will provide an optimum solution for a single chip, and it is certain that such an approach will be inadequate for a multi-chip partitioned function. From this discussion, it becomes evident that what is needed is a placement seed which represents—not a single proliferating source point—but many source points that represent many chips or regions of growth in a chip. This 'slack net hierarchy' can be used advantageously to generate such a seed.

Having properly prioritized the 'net segment' timing, a list of multiple nested 'net segments' is created by the next step, 'solitaire' procedure, (block 104, FIG. 1) which modifies the placement 'solitaire' procedure is based on net 'coagulation'. Starting from the 'shortest' nets in the 'distance-between-blocks' hierarchy, groups are columnized in a manner similar to playing solitaire. Every net connection comprised of its two blocks (source and destination) is represented by a pair of letters or symbols (e.g., x,y). With each succeeding entry, the following questions are asked:

Does the first symbol appear in a list?

Does the second symbol appear in a list?

If the answer is (no, no), then this pair becomes the first entry in a new list.

If the answer is (yes,no) or viceversa, then this pair is added to the existing matched list;

If the answer is (yes,yes), then this pair is added to one of the matching lists, and the matching lists are merged.

This procedure tends to produce multiple lists which are independent of one another up to a net length ar-rived via the (yes,yes) decision of the 'net segment' pair. For some applications, the lists may not be of equal length or adequate number. This is particularly true in cases that require multiple partitions of roughly equal size (e.g., chips). In such instances, a simple net coagulation is insufficient and further intelligence is required. Intelligent manipulation of the lists may be achieved by list merging rules as well as by block 'rating' rules, all of which are readily known and available to one skilled in the art.

Sudden link up of 'centers-of-growth' in the 'solitaire' procedure is accommodated by the 'ascendency' rule. As 'centers-of-growth' accumulate circuit count, they can be visualized as ever-expanding regions of population, with ever-increasing radii. The sudden link-up of two such groups, by net connections somewhere within them, requires a new 'net segment' whose length is somewhere between one unit and the sum of group's A radius and group's B radius, (asserting that no other links exist between them at this point). If nets were to be listed and processed randomly in terms of their length, a short 'net segment' requirement between the two 'centers-of-growth' might demand a very small net connection at a point where the two radii made this impossible. By using the 'ascendency' rule, the net connection link-ups deliver longer connections in the same order in which they are geometrically required.

An Example

To further illustrate the methodology defined thus far, reference is made to FIGS. 2 through 6.

Shown in FIG. 2a is a simple logic arrangement consisting of 13 interconnected blocks having $I_1$, $I_2$ and $I_3$ as inputs, and $O_1$, $O_2$ and $O_3$ as outputs. Each total path delay is comprised of path member block delays and of 'net segment' delays. The first step of the inventive methodology 'initialize path definition' (block 100, FIG. 1) requires a listing of all the paths which complete some work function in a clock cycle. The inputs and outputs represent cycle initiation and termination points for the paths shown.

Figures 2D, 2E, 2F:
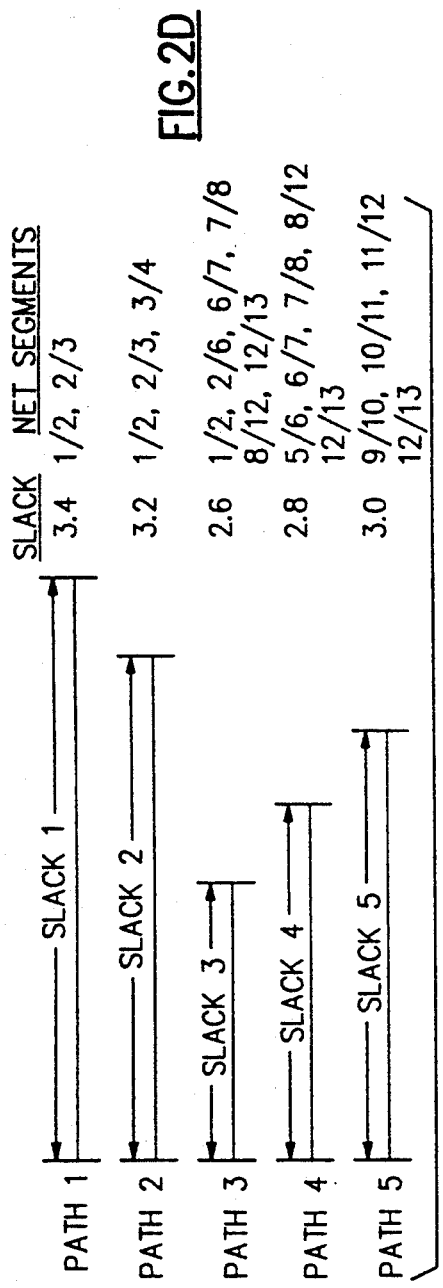

Referring now to FIG. 2b, to the right of each path are the number of blocks in each path. Within a given cycle time, each path is graphically represented by a unit block delay of every block in the path, leaving the previously defined slack as the balance of the cycle time (FIG. 2c). The next step calls for 'removing functional delays' (block 101, FIG. 1) leaving only the 'net segment' delays, as graphically shown in FIG. 2d. Particular attention is drawn to each 'net segment' which is expressed by its source and destination variables.

In order to better understand and appreciate the 'equipartition' rule (block 102, FIG. 1), a matrix is formed comprised of as many rows as there are paths and as many columns as there are 'net segments'. The pertinent elements of the matrix are given either 'P', for each 'pinned net segment' or 'X', for each 'free net segment' (FIG. 2e). Under the 'equipartition rule', each slack is divided by the corresponding number of 'net segments' (FIG. 2f) and each 'net segment' is then individually assigned the resulting 'net segment' value.

The multiple 'net segment' delay values derived from the 'equipartition' rule are then set to the smallest calculated value for each 'pinned' segment and appropriate substitution is made wherever that segment appears (FIG. 2g).

Listed in FIG. 2h are the slacks for each 'net segment'.

'Net segments' are prioritized next by means of the 'ascendency' rule (block 103, FIG. 1), whereby the net slack sequence is ordered in ascending order (FIG. 2i). If the actual placement of blocks results in precisely the same 'net segment' slack values, the path delays shown in FIG. 2j will then result.

From the discussion on the 'ascendency' rule it is evident to those skilled in the art that the key point is not the projected path delay values but rather understanding the 'equipartition' rule whereby the smallest value for a 'pinned' segment guarantees that the most crucial 'net segments' (i.e., block placements) will be handled first through the 'ascendency' rule for 'net segment' listing. This, in turn, guarantees that a path will receive placement priority and attention proportional to their timing criticality. Thus, pivotal block placements affecting the most critical nets will be given highest priority.

More specifically, each 'net segment' will have a delay factor attached to it that can be used to generate a 'distance between blocks' hierarchy for generating a placement seed. This leads to a typical block representation, as shown in FIG. 2k, where the numbers shown represent units of length or units of delay.

A seed placement may start by placing all short 'net segments' delays required first. Thus, the blocks connected by these nets would be seeded locally first. Longer length segment member blocks would be placed next, etc. Conflicts arising between long and short requirements for a single block would be addressed by the Annealing algorithm to achieve minimum energy, which in this case is the difference between the desired net delay and the actual placement delay.

Figures 2K, 3A, 3B:
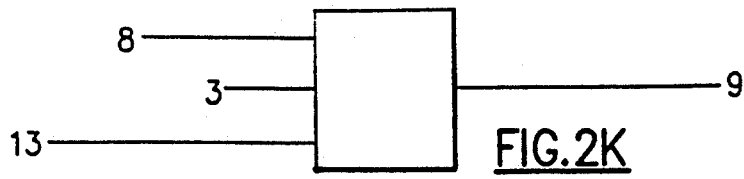

FIG. 3a shows a new reduced list of 'net segments' arranged in increasing order of 'slack value' in accordance with the previously described 'ascendency' rule. From it, the 'solitaire' procedure is applied defining a natural partitioning that leads to the formation of a plurality of growth centers (FIG. 3b).

Upon completion of the execution of the aforementioned procedures, a 'prioritized placement' with a nested hierarchical structure will have been established.

This allows for reconstructing and analyzing the whole process of 'accretion' and 'aggregation' (FIG. 4) as the CPU logic mass develops. The nested hierarchy offers a guide to the development of natural boundary choices while, simultaneously, providing the necessary information about the I/O count and integration size of any given partition choice.

The dynamic sequence of growth center accretion and center-to-center aggregation may be captured and preserved in a coded structure. If growth centers are attributed and merging operations are catalogued in an indexed hierarchy, a road map or tree-structure of the developing logic mass will emerge.

Figure 4:
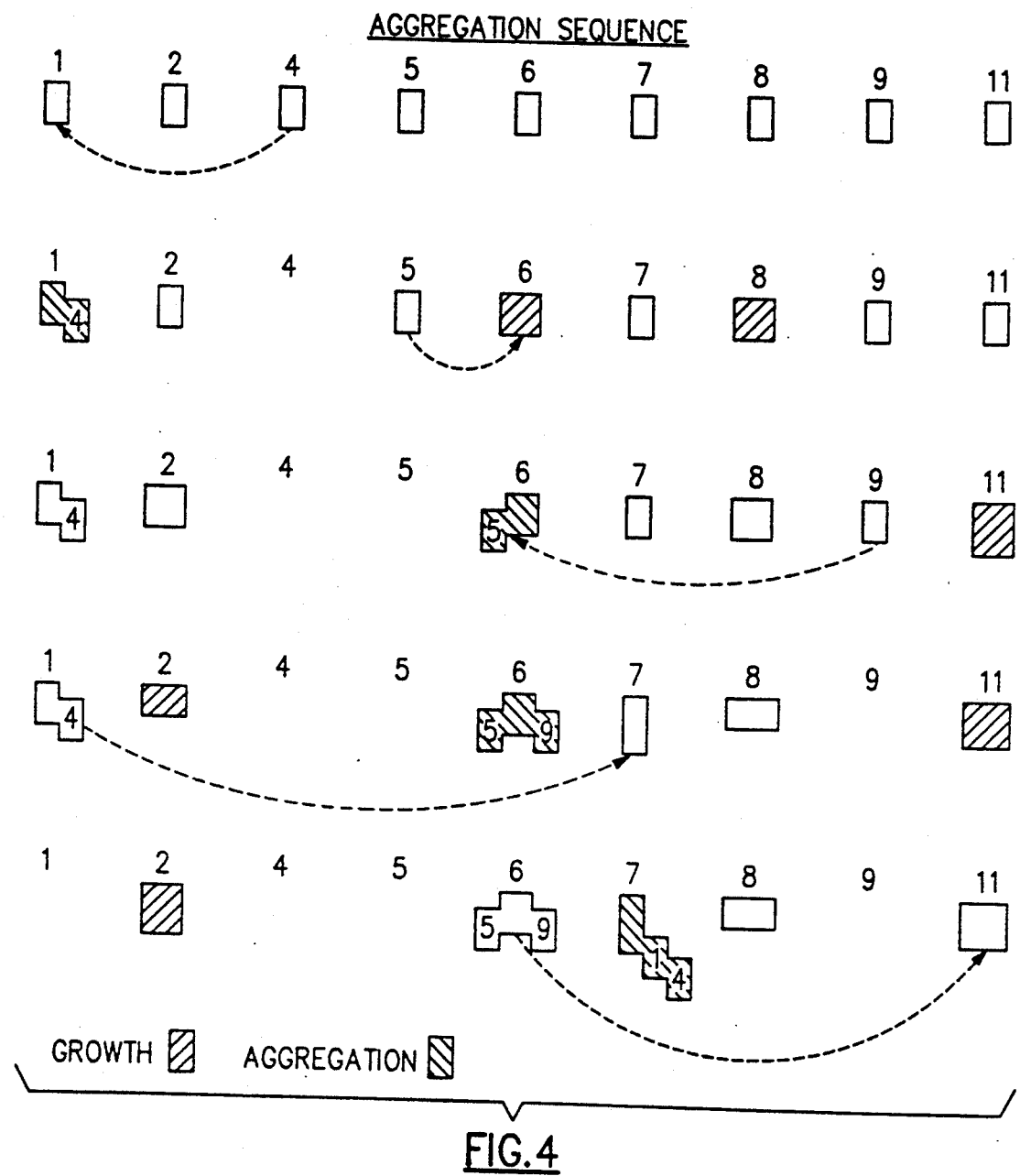
FIG. 4 is an example of a 'net segment' hierarchy partitioned by growth order leading to nested levels, their representation including level subsets.

The nested groupings (i.e., growth centers) within the 'ascendency' hierarchy the evolution of the developing logic mass. It symbolizes dynamic partitioning due to the fact that specific groups are growing independently from one another until the first connection which merges that specific set of groupings is achieved. From that point on, the merged groups are treated as one larger group (FIG. 4).

The 'ascendency' sequence listing provides the order in which groups are merged. Together, the nesting and list sequence provide a history of the evolution of 'aggregation' and 'accretion'.

Indexing helps the 'timing compensation placement' (TCP) process in two areas:

1) Partitioning, whereby the tree-structured hierarchy of levels will allow I/O interconnect evaluations for different partition strategies and integration sizes. As partitions are modified, the I/O's will automatically change to reflect the moving boundaries. Interconnection counts among all partitioned entities are available to estimate signal I/O requirements as well as I/O interconnection delay requirements vs. chip partitioning and positioning.

2) Placement, whereby group-to-group placement prioritization is provided by the 'solitaire' and link-up procedures.

Figure 5C:
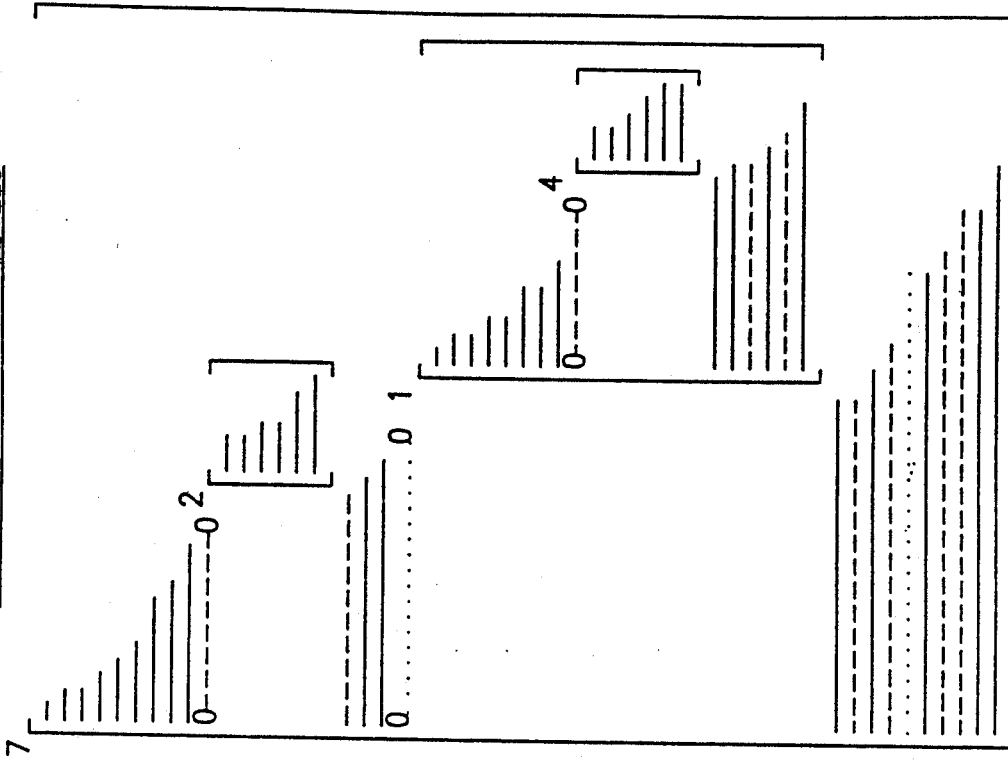
FIGS. 5A-5D illustrate the 'aggregation' and 'accretion' sequences.
Figure 5A:
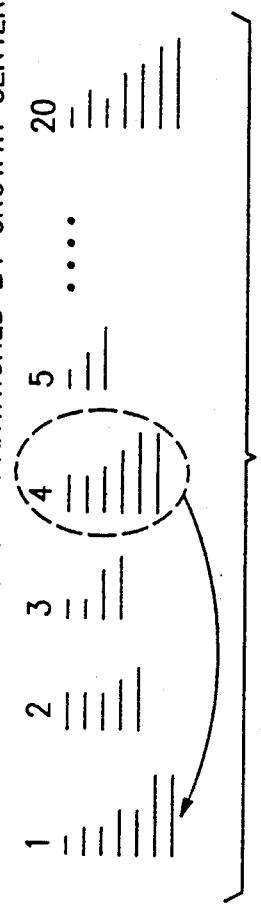
Figure 5B:
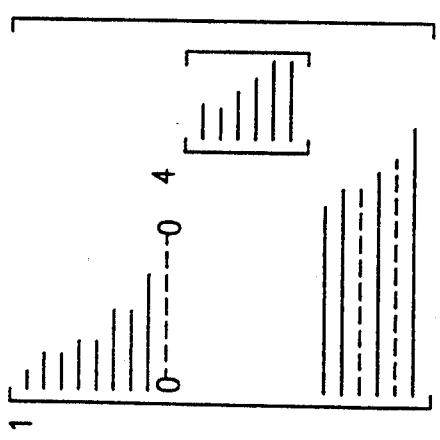
Figure 5D:
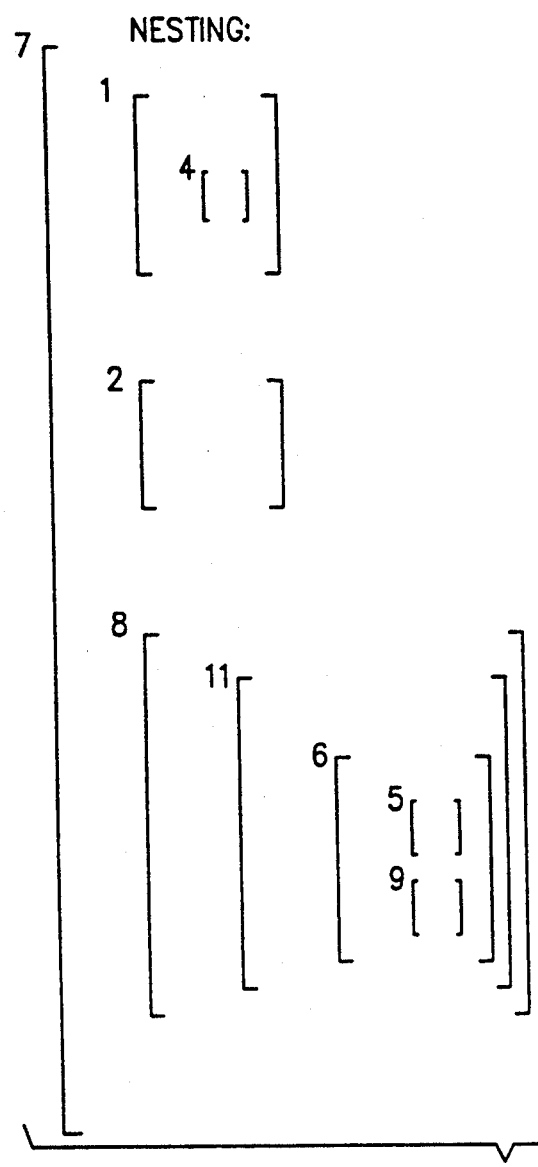
Figure 5D:
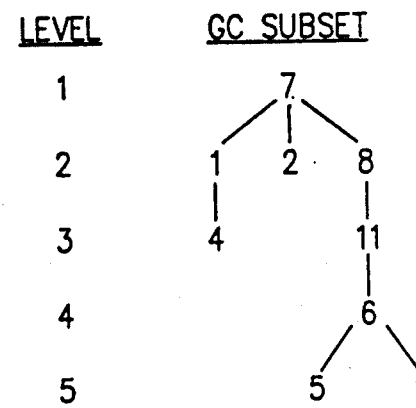

The 'nested sequence' can best be understood by referring to FIG. 5, wherein an example of a 'net segment' hierarchy partitioned by growth order is shown, (FIG. 5a), leading to the indexed growth history (FIG. 5b); from it, to a plurality of nested levels (FIG. 5c), and finally to a representation of plural levels and corresponding subsets of those levels (FIG. 5d).

The rectangular blocks, referred to as 'growth centers', contain a plurality of sets of logic block connections (i.e., 'net segments') based on path criticality timing requirements and associativity.

'Aggregation' occurs when a 'net segment' links logic blocks members which reside in two previously independent growth center's groups. With this new 'net segment' the two groups are suddenly linked and merged in the nested hierarchy. As shown in FIG. 5, a new 'net segment' has linked a block in group 1 to a block in group 4. As a result, group 4 is now merged with group 1. Finally, 'accretion', the method for adding additional 'net segment' members to an existing growth center is symbolically and pictorially demonstrated in FIG. 4 by the widening of rectangles (growth center), blocks 6 and 8.

Accordingly, it has been established how to initiate a suitable initial placement based on the steps thus far described in FIG. 1, block 106. As the process flow diagrams indicate, the prioritized placement procedure can be followed by a preliminary design assessment of the most appropriate partition boundary choices. These choices can be inserted into the model and a new prioritized placement hierarchy established.

Referring now to block 105 in FIG. 1, the prioritized placement procedure is followed by a preliminary assessment of the most appropriate partitioning boundary choices. These choices can be taken into account by establishing a new placement hierarchy without resorting to any physical placement of blocks. This is true because the 'ascendency/nesting hierarchy' allows first-pass deductions without regard to geometric placement decisions. These considerations allow modelling an idealized placement which lacks partitioned boundaries. This is particularly well suited as a starting point for an analysis of the design process. More particularly, it allows a designer to assess in approximate form, the impact of placement within the constraints of a two-dimensional (planar) space. The master grid placement of blocks within a predefined x,y coordinate system results in a delay factor for each segment connected to the blocks. These net segment delays lead to path delays. A designer may thusly obtain an approximate feeling for his path delay distribution to assess the 'time-of-flight' penalties associated with planar distances thereby assessing the impact of various partition boundary choices on the path delays. In this manner, the effect of planar design can be segregated from those of partitioning. Upon completion of the placement procedure the 'net segment' values can be retrieved from the Placement File and inserted in the path equation to predict the actual delay.

Referring now to the feedback paths, blocks 109, 110 and 111 in FIG. 1, various alternatives can be exercised depending on the course of action set by the results of the placement evaluation (blocks 105 or 108). If partitioning is allowed, a certain slack reduction will result from:

1) assigning a special partition output driver delay value to each set of blocks which are partition boundary choices, (Note: a block can represent a chip, module, card, etc. The delay characteristics are altered to account for a block chosen as a driver or receiver), and 2) assigning a special value to the 'net segments' that link partitions at the next level.

In the case of an unpartitioned path, the path slack was equally divided among the segment members to achieve a first-pass priority approximation for placement. This so-called 'equipartition' approximation may require alteration for the partitioned path case. Although all 'net segment' delays are a function of the distance between blocks, the difference between the distribution of 'net segments' within a partition and the distribution of 'net segments' between partitions is radically different.

Provisions can be made so that partition choices can automatically change internal blocks to partition drivers, and their block delay to driver delay. Altered delay values of the selected driver blocks will permit new path slack calculations and new 'net segment' 'ascendency' hierarchies. The new 'net segment' list sequence may then result in an altered 'solitaire' procedure result and a new placement.

For the I/O 'net segments', a new delay value can be calculated based on the positions of the partitions and the resulting 'come from/go to' master grid coordinates. This length, coupled to a module net delay multiplier, enables the construction of new path delay values based on the 'net segment' delays and block delays of all members of each path.

Figure 6A:
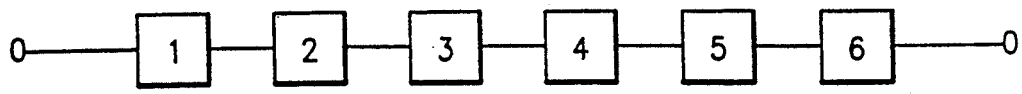
Figure 6A:
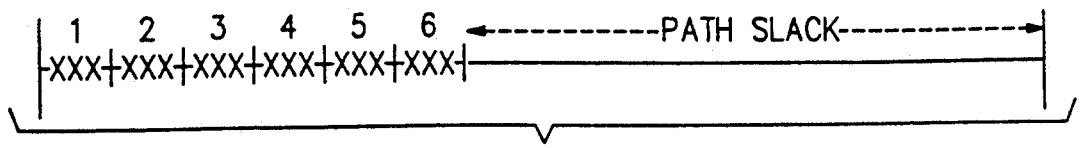

FIG. 6a illustrates an unpartitioned path whereby, for illustration purposes, the functional blocks are set equal to each other, leaving a path slack independent of any partition.

Figure 6B:
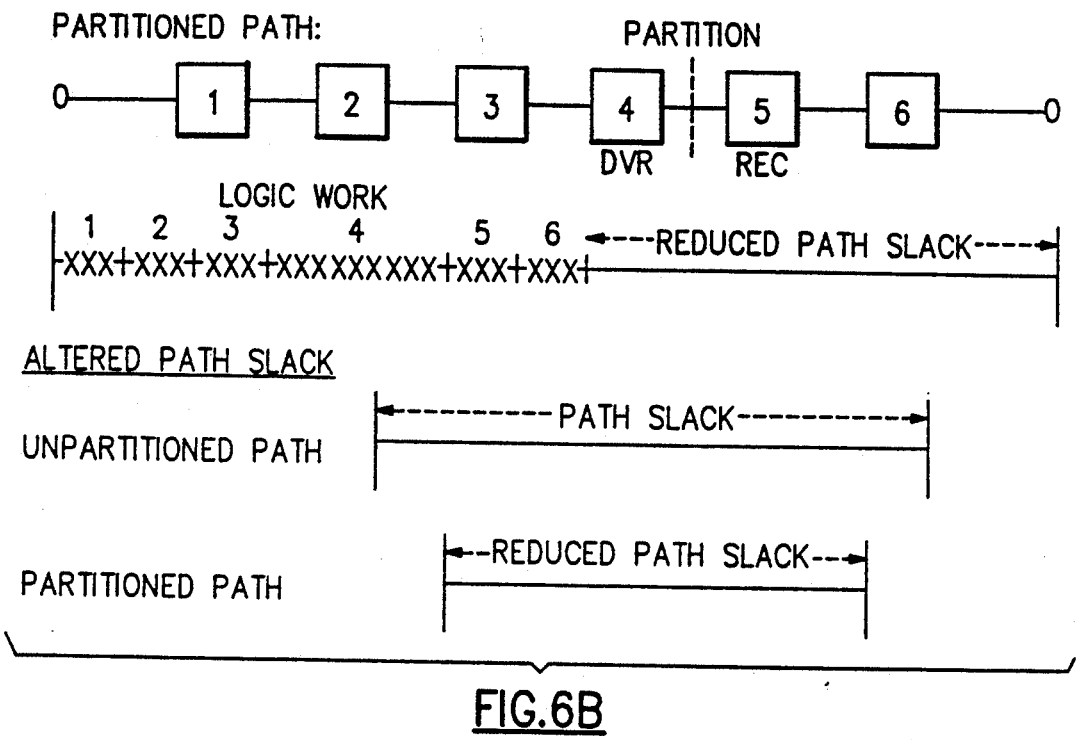

The same path is shown in FIG. 6b with the exception that slack path is reduced as a result of partitioning. Additional delay is added to the functional block that corresponds to a partition driver, which in turn reduces the path slack.

The mean (average) distance for the distribution of on-chip net segments is measured in cell pitches. The mean (average) distance for the distribution of chip-to-chip 'net segments' is measured in chip pitches.

Figure 6C:
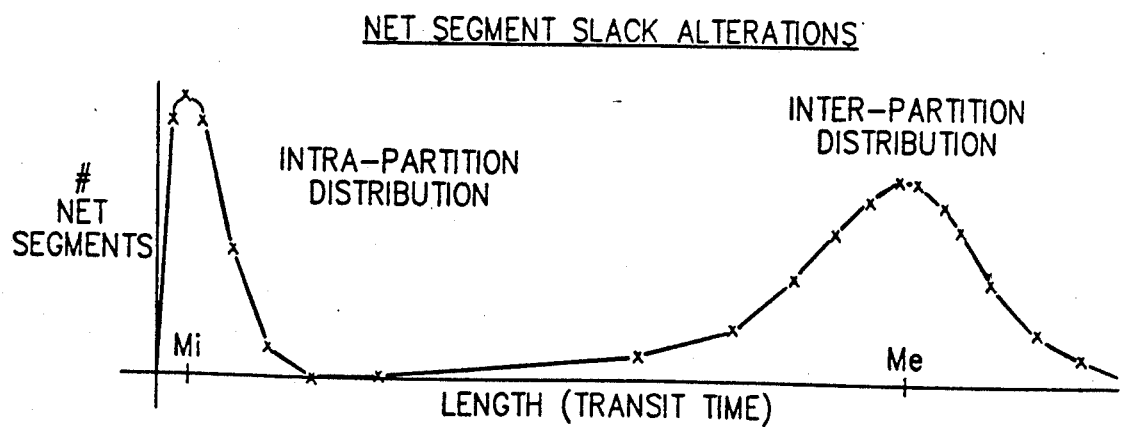

By way of illustration, FIG. 6c shows a distribution of the 'net segments' alterations as a function of length (e.g., transit time). The curve shows two clusters, one centering around Mi that corresponds to the intra-chip distribution and the other centering around Me that corresponds to the inter-chip distribution.

Referring now to FIG. 6d, in the unpartitioned case, the path slack is equally divided among all 'net segments' (a result of applying the equipartition rule. Thus the total 'net segment' slack is just the total slack divided by the number of 'net segments'. In the partitioned case, (after reducing the total path slack by the amount corresponding to the delay associated with special circuits), the altered 'equipartitioned' slack is modified where appropriate by the additional chip-to-chip considerations, thus providing a more realistic picture of the 'net segment' topology. It is evident that in the instance of excessive chip-to-chip delay assigned by the partitioning to various 'net segments', an unacceptably small reduced slack may remain to be divided among the 'net segments' left on the path, thus invalidating the design. This can prove to be a very effective tool for a designer in his quest for an optimized distribution.

At this point, the requirement for recalculating the net segment priority becomes necessary and is achieved by the 'altered equipartition'.

A means for accounting for the difference between internal and external 'net segments' would be to generate an expression for the external 'net segments' which approximates their length (time delay) in internal 'net segment' equivalents. Thus, the partition boundary 'net segments' are re-expressed as an equivalent number of internal 'net segments'. This allows for executing the original 'equipartition' procedure in a more realistic division of the path slack apportionments (FIG. 6D). Thus, a new 'ascendency' hierarchy is established for prioritized placement. This prioritized placement is accomplished without physical placement of the blocks. When the physical placement is undertaken, the actual 'net segment' delays may be calculated from equations which determine the length from the x,y coordinate information of the physical placement.

Referring again to block 111, the x,y unpartitioned placement may contain most of the partitioning impact within it. The x,y placements and distances of the unpartitioned layout can correspond to the same distances that a partitoned external net would have. The alterations of the delay are primarily due to:

1) the increased delay of the driver block that will decrease the available path slack, and 2) the added distance of the chip border when the chips are not 'brick-walled' on the module. These can be expressed as:

Border = chip pitch − chip size.

It is evident to those familiar with the art, that it is possible to model an idealized placement without partitioned boundaries. Although it may be unrealistic, nonetheless, it is an excellent starting point for analyzing the design process. It allows a designer to assess in approximate form, the impact of placement within the constraints of a two-dimensional (i.e., planar) space.

The 'master grid' placement of blocks within a given x,y coordinate system results in a timing delay factor for each net segment connected to the blocks. These 'net segment' delays, in turn, result in path delay. The designer should get an approximate feeling for this path delay distribution to assess the 'time-of-flight' penalties associated with planar distance, and to assess the impact of various choices of partition boundaries on the path delays. In this manner, it becomes feasable to separate the effects of planar design from those of partitioning.

Optimization: Path Slack Dependent 'Cost' Function

Completion of the initial physical placement by means of the previously described steps (blocks 100 through 106) leads to the required optimization portion of the inventive methodology.

Combinatorial optimization heuristic techniques have been developed with a variety of 'cost' or 'objective' functions to guide the exploration through the design space. A number of early iterative techniques made use of an evaluation criteria that accepted only rearrangements leading 'downhill', i.e., that improved the cost function. Such searches usually converged on a local optimum, but rarely on a global optimum. Succeeding refinements to the 'cost' function allowed for the probabilistic acceptance of 'uphill' as well as 'downhill' moves, allowing the algorithmic procedure to avoid becoming stuck at a local minimum.

Practitioners of this art have advantageously used the concept of 'energy' in a Boltzmann's acceptance analog to statistical mechanics. Thus, the usual iterative improvement techniques that utilize combinatorial optimization and statistical mechanics apply the Bolzmann Temperature factor equally to all placements at a given 'temperature'. This permits an equal 'degree of freedom' for all block placements, which is gradually reduced as the 'temperature' is reduced and the placement stabilizes.

It is the intention of this methodology to disproportionately restrict the freedom of the longest path, while at the same time maximizing the overall placement freedom by allowing the non-critical nets to maneuver within their wider design space. Thus, a modified criteria could be established in which Boltzmann compare would be net criticality dependent. Under such criteria, a placement that reduces the 'energy' would be accepted, whereas if it would increase the 'energy', its acceptance would be based on the probability of a random number being less than the value of the Bolzmann's function of the form $\exp(-E/kS)$, whereby the new variable S is path dependent and a function of the slack of the path. As an example:

$$S = T \times (\text{cycle time/slack}),$$

where T is the 'temperature' variable.

Thus, placements that increase path delay for the more restricted nets, i.e., the longer 'critical' nets, would most probably be rejected, whereas, placements that increase path delay for the less restricted nets would have a higher probability of being accepted. This is true because it is possible for them to increase their delay up to a point of accommodating physical placement requirements without impacting cycle time (set by the critical nets).

This 'priority based on criticality' methodology attempts to minimize the longest path delay and not the average path delay (e.g., total wire or total capacitance). Since in general, long paths contain a large number of functional blocks, the path definition results in the smallest slack time divided over a large number of net segments. Consequently, these paths have highly restricted degrees of placement freedom because of their limited 'net segment' length, and the number of 'net segments' which must lie in proximity of one another. Moreover, since placement freedom is not symmetric, expansion will end with better probability of success than contraction. Thus, the longest paths with the shortest slack are given the highest priority in placement.

This technique can be considered global (also referred to as machine wide because the relative freedom of placement (or acceptance) is based on the criticality of all paths, 'nets segments', etc., of all the circuits that comprise the machine.

Optimization in the presence of 'Path Bundling'

The application of 'cost' functions, which essentially treats a net as the entity to be examined, may create 'path bundling', whereby path 'net segments' are grouped together and analyzed in aggregates. This transformation converts sets of distinct path-identified 'net segments' into a pseudo-delay variable to be called 'net'. A disadvantage of this approach is the conversion of specific path analysis capabilities into a technique for delay averaging.

Critical path 'net segment' requirements end up being analyzed in conjunction with the combined statistics of non-critical 'net segment' members of the same 'net'. Thus, the analysis is conducted at a more abstract level, whereby less total wire, less net capacitance, etc., are considered as being better.

Previously, the preferred placement introduced was path dependent, with the measure of acceptance or 'goodness' based on a path slack value. To successfully achieve this goal, it is necessary that, in the process of optimizing a block placement, the analysis include changes in multiple paths. In the 'constructive initial placement' procedure and block placement hierarchy this was not a problem, because the 'ascendency' list— which dictates the order of placement criticality—was based on 'net segments'. Thus, it was possible to separate path effects from one another during the process of placing blocks.

'Placement optimization' procedures differ in that, prior to optimization, all tentative blocks and 'net segment' connections must already be in place. Thus, any block placement change and evaluation involves all the 'nets segments' connected to the block being moved (i.e., the entire net). As a result, a number of path delays will be simultaneously affected by that single block movement. It is, therefore, evident that some criterium must be established to analyze the composite 'goodness' of positive and negative path delay impacts resulting from repositioning of blocks.

'Goodness' can be measured by attempting to incorporate:

1) a comparison criterium based on previous values, longest paths and cycle time, and 2) prioritizing a path dependence based on 'criticality'.

'Goodness' can be quantified by the following sequence of steps:

1) Defining net and block changes in term of 'net segments' and paths;

2) Assigning a 'criticality' value to each path and 'net segment' in the various lists based on path slack or 'net segment' criticality assigned by the 'ascendency' list priority order, i.e., position based on 'ascendency';

3) Coding the 'criticality' value previously defined by binary weight indexing (e.g., $2^0, 2^1, 2^2, \ldots 2^n$ etc.), with the most critical path assigned to the most significant digit. For example, the most critical net would have an indexed weight of $2^n$ and the least critical net segment, an index weight of $2^0$;

4) Letting a symbol, such as a binary number, e.g., a '+' (defined as a 1) show improved 'goodness' (i.e., shorter path, ... and a '−' (defined as a 0) show deteriorated 'goodness' (e.g., longer path, ...);

5) Coding the composite path results in ascending binary numbers, and basing acceptance on the composite weight of the binary number translation.

This technique can be viewed as local because the relative freedom of placement (or acceptance) depends on criticalities (path slack/'net segment' slack) which are based only on 'net segments' participating in the net under consideration.

By way of example, a net comprised of three 'net segments' is shown in FIG. 7a, whereby:

$$NET1 = NS(A) + NS(A) + NS(C)$$

Figures 7B, 7C:
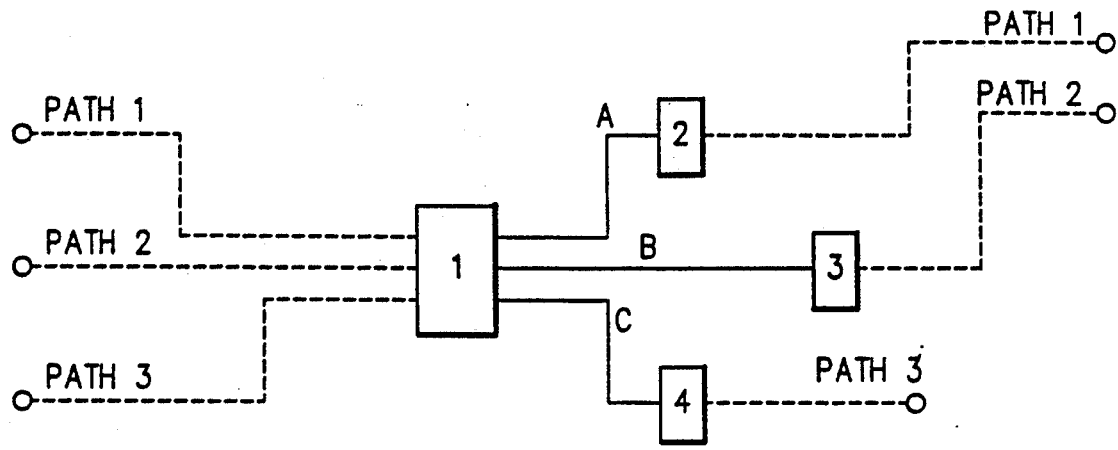

Three possible paths are shown in FIG. 7B with their respective slack, 'criticality' and assigned indexes weight, and the ensuing 'composite acceptance weight' for each of the paths and placement results (FIG. 7C).

In summary, a method has been described that provides timing compensation placement and partitioning, advantageously creating means for producing:

1) An initial constructive placement seed for 'heuristic' optimization techniques;
2) Improved 'Cost' Functions for minimized cycle times based on the timing criticality of 'net segments'; and
3) Means for intelligent involvement in the 'fast machine' solution process by allowing interaction, intervention and decision making to machine partitioning, book placement, chip geometries, package configurations, etc.

While the present invention has been particularly shown and described with reference to a preferred embodiment, it will be understood by those skilled in the art that the foregoing and other changes in form or detail, such as altering the 'cost' function definitions in the Annealing and Genetic procedures, may be made herein without departing from the spirit or scope of the invention.

What is claimed is:

1. A computer implemented method for minimizing path delay and optimizing cycle time of a circuit design, said circuit design having a plurality of blocks connected to each other by interblock net segments, said method comprising the steps of:
   a) measuring path criticality as a function of path slack;
   b) cataloguing said paths comprised of net segments contained in nets attached to a placed block for determining all the paths affected by a selected block placement;
   c) developing an acceptance factor based on the most critical path in said nets, whereby said path criticality acceptance factor is based on the ratio of said path slack to said machine cycle time; and
   d) interconnecting the blocks comprising said circuit design in accord with said improved net segments configuration, thereby achieving an optimized circuit design.

2. The computer implemented method for minimizing path delay and optimizing cycle time of a circuit design as recited in step c) of claim 1, wherein said critical acceptance factor is based on the relative position of a path within said path slack criticality as defined in said ascendency list.

3. A method for optimizing path delay and machine cycle time as recited in claim 1, whereby the cost function acceptance criteria is a function of the combined effect of global criticality and local composite weighting of all said paths in the nets affected by a selected block placement.

4. A method for optimizing delay and machine cycle time as in claim 3, wherein said cost function is the combined effect of global criticality and local composite weighting of all said net segments int he nets affected by a selected block placement.

5. A computer implemented method for minimizing path delay and optimizing cycle time of a circuit design based on global considerations, said circuit design having a plurality of blocks connected to each other by interblock net segments, said method comprising the steps of:
   a) measuring net segment criticality as a function of net segment slack;
   b) cataloguing said net segments contained in nets attached to a placed block for determining all said net segments affected by a selected block placement;
   c) developing an acceptance factor based on the most critical net segment in said nets, whereby said net segment criticality acceptance factor is based on the ratio of said net segment slack to said machine cycle time; and
   d) interconnecting the blocks comprising said circuit design in accord with said improved net segments configuration, thereby achieving an optimized circuit design.

6. The computer implemented method for minimizing path delay and optimizing cycle time of a circuit design as recited in step c) of claim 5, whereby said critical acceptance factor is based on the relative position of a net segment within said net segment slack criticality as defined in said ascendency list.

7. A computer implemented method for minimizing path delay and optimizing cycle time of a circuit design, said circuit design having a plurality of blocks connected to each other by interblock net segments, said method comprising the steps of:
   a) determining the delay of each of said net segments interconnecting said blocks and prioritizing said net segments in accordance to a predetermined criterion for criticality;
   b) achieving an initial coarse approximation to a final optimum configuration based on said net segment criticality;
   c) improving said coarse approximation to the final optimum configuration by assigning a cost function to said net segments as a function of said net segment criticality;
   d) using said cost function to achieve by heuristic means an improved net segment configuration over the initial coarse approximation; and
   e) interconnecting the blocks comprising said circuit design in accord with said improved net segments configuration, thereby achieving an optimized circuit design.

8. The computer implemented method for minimizing path delay and optimizing cycle time of a circuit design as recited in step c) of claim 7, whereby improving said initial placement is achieved by improving electrical parameters of the most critical said net segments.

9. The computer implemented method for minimizing path delay and optimizing cycle time of a circuit design as recited in step c) of claim 7, whereby improving said initial placement is achieved by improving timing parameters of the most critical said net segments.

10. The computer implemented method for minimizing path delay and optimizing cycle time of a circuit design as recited in step c) of claim 7, whereby configuring all said net segments is achieved by evaluating the hierarchical criticality of all paths and net segments that comprise a given net.

11. The computer implemented method for minimizing path delay and optimizing cycle time of a circuit design as recited in step c) of claim 7, whereby said initial placement is achieved by random means.

12. The computer implemented method for minimizing path delay and optimizing cycle time of a circuit design as in step a) of claim 7, whereby block placement priorities are adjusted to reflect the selection of selected net segments as partition boundaries, whereby adjustments to the path slack are altered by the choice of a block as a boundary partition as a driver or receiver, and whereby the reapportionment of said path slack is achieved by adjusting the original equipartition rule to account for a partition boundary net segment which is many times larger than the net segment within said partition.

13. A method for optimizing delay and machine cycle time as in claim 7, whereby said prioritizing of said net segments is based in the combined effect of criticality and associativity, wherein said net segments are considered in order of their critical position in an ascendency list and are segregated into a plurality of subsets based on said associativity, and wherein subset linkage is achieved in a hierarchical structure through the first appearance of said net segments whose source and destination blocks reside in at least one of previously unconnected said subsets.

14. A computer implemented method for minimizing path delay and optimizing cycle time of a circuit design, said circuit design having a plurality of blocks connected to each other by interblock net segments, said method comprising the steps of:
   a) generating a set of path delay equations for all machine paths in terms of block delays and interblock net segment connections;
   b) generating a path delay slack by subtracting the total functional block delay of said path from the cycle time requirement;
   c) expressing the set of said path delay slacks for all machine paths, such that each of said path delay slack is comprised of a summation of net segment delay factors defined in terms of source and destination tags of said net segments;
   d) estimating an initial net segment slack by applying equipartition rule;
   e) extracting the smallest delay value of multiple path net segments from a list of multiple values for all multi-use "pinned" net segments and using said smallest value as a singular value for said multiple path net segments;
   f) ordering all said net segments in ascending slack value;
   g) accounting for associativity among said net segments by establishing growth centers of said net segments to achieve net coagulation; and
   h) interconnecting the blocks comprising said circuit design in accord with said improved net segments configuration, thereby achieving an optimized circuit design.

15. The computer implemented method for minimizing path delay and optimizing cycle time of a circuit design as recited in step b) of claim 14, which includes the additional steps of: h) ordering said set of path delay slacks in ascending slack values for each of said machine paths; and i) prioritizing said set of path delay slacks by long paths followed by short paths.

16. The computer implemented method for minimizing path delay and optimizing cycle time of a circuit design as recited in step e) of claim 14, whereby extracting the smallest delay value for multi-path net segments is followed by: substituting the newly calculated smallest values for multi-path net segments into said equations of all paths containing said multi-paths net segments; and recalculating the "free" said net segments of said paths by subtracting said newly calculated smallest value from the path slack and reapportioning the remaining slack among said "free" net segments by equipartition rule.

17. The computer implemented method for minimizing path delay and optimizing cycle time of a circuit design as recited in steps f) and g) of claim 14, whereby partition boundaries that are compatible with timing requirements of each said net segment are obtained by means of nested hierarchy.

18. The computer implemented method for minimizing path delay and optimizing cycle time of a circuit design as recited in claim 17, whereby said nested hierarchy is based upon the first net coagulation between two previously independent groups of said net segments.

19. A computer implemented method for minimizing path delay and optimizing cycle time of a circuit design based on local considerations, said circuit design having a plurality of blocks connected to each other by interblock net segments, said method comprising the steps of:
   a) measuring path criticality as a function of path slack;
   b) cataloguing said paths comprised of net segments contained in nets attached to a placed block for determining all the paths affected by a selected block placement;
   c) indexing all said net segments contained in each in said nets by assigning a composite weight generated by a code based on path criticality, whereby the assigned indexed weight for each net segment in said nets is likewise a function of path criticality such that the highest indexed weight is assigned to the net segment contained in the most critical path;
   d) developing an acceptance factor based on said composite weight, whereby composite weight is a function of path criticality of each net segment in said net, and whereby said composite weight is defined by a code containing said indexed weight for each said net segment in said net; and
   e) interconnecting the blocks comprising said circuit design in accord with said improved net segments configuration, thereby achieving an optimized circuit design.

20. A method for optimizing path delay and machine cycle time as recited in claim 19, whereby the cost function acceptance criteria is a function of the combined effect of global criticality and local composite weighting of all said paths in the nets affected by a selected block placement.

21. A method for optimizing delay and machine cycle time as in claim 20, whereby said cost function is the combined effect of global criticality and local composite weighting of all said net segments in the nets affected by a selected block placement.

22. A computer implemented method for minimizing path delay and optimizing cycle time of a circuit design based on local considerations, said circuit design having a plurality of blocks connected to each other by interblock net segments, said method comprising the steps of:
  a) measuring net segment criticality as a function of net segment slack;
  b) cataloguing said net segments contained in nets attached to a placed block for determining all the net segments affected by a selected block placement;
  c) indexing all said net segments contained in each said nets by assigning a composite weight generated by a code based on net segment criticality, whereby said assigned indexed weight of each said net segment in said nets is likewise a function of net segment criticality, and such that the highest indexed weight is assigned to the net segment deemed most critical;
  d) developing an acceptance factor based on said composite weight, whereby said composite weight is a function of the criticality of each said net segment in said net and whereby said composite weight is defined by a code containing said indexed weights for each said net segment in said net; and
  e) interconnecting the blocks comprising said circuit design in accord with said improved net segments configuration, thereby achieving an optimized circuit design.

* * * * *